United States Patent [19]
Consiglio et al.

[11] Patent Number: 5,682,047
[45] Date of Patent: Oct. 28, 1997

[54] INPUT-OUTPUT (I/O) STRUCTURE WITH CAPACITIVELY TRIGGERED THYRISTOR FOR ELECTROSTATIC DISCHARGE (ESD) PROTECTION

[75] Inventors: Rosario Consiglio, San Jose; Yen-Hui Ku, Cupertino, both of Calif.

[73] Assignee: LSI Logic Corporation, Milpitas, Calif.

[21] Appl. No.: 484,003

[22] Filed: Jun. 7, 1995

[51] Int. Cl.⁶ .......................... H01L 23/63; H01L 29/76; H02H 9/00; H02H 3/22
[52] U.S. Cl. .......................... 257/335; 257/141; 257/133; 257/360; 257/363; 361/91; 361/56; 361/111
[58] Field of Search .................... 257/173, 172, 257/107, 355, 357, 358, 360; 327/432, 453, 438, 439, 440, 465, 470

[56] References Cited

U.S. PATENT DOCUMENTS

| | | | |
|---|---|---|---|
| 4,633,283 | 12/1986 | Avery | 357/23.13 |
| 4,649,414 | 3/1987 | Ueda et al. | 357/53 |
| 4,777,518 | 10/1988 | Mihara et al. | 357/23.13 |
| 4,870,530 | 9/1989 | Hurst et al. | 361/91 |
| 4,888,627 | 12/1989 | Pattanayak et al. | 357/23.4 |
| 4,928,157 | 5/1990 | Matsunaga et al. | 357/23.13 |
| 4,939,616 | 7/1990 | Rountree | 361/56 |
| 4,994,874 | 2/1991 | Shimizu et al. | 357/23.13 |
| 5,012,317 | 4/1991 | Rountre | 357/38 |
| 5,072,273 | 12/1991 | Avery | 357/38 |
| 5,077,591 | 12/1991 | Chen et al. | 357/23.13 |
| 5,140,401 | 8/1992 | Ker et al. | 357/43 |
| 5,142,641 | 8/1992 | Fujioka | 357/42 |
| 5,173,755 | 12/1992 | Co et al. | 257/361 |
| 5,182,220 | 1/1993 | Ker et al. | 437/34 |
| 5,225,702 | 7/1993 | Chatterjee | 257/360 |
| 5,237,395 | 8/1993 | Lee | 257/358 |
| 5,270,565 | 12/1993 | Lee et al. | 257/385 |
| 5,281,841 | 1/1994 | Van Roozendaal et al. | 257/360 |
| 5,452,171 | 9/1995 | Metz et al. | 361/56 |

OTHER PUBLICATIONS

Krieger, Gadi and Niles, Peter; *Diffused Resistors Characteristics at High Current Density Levels—Analysis and Applications*; IEEE Transactions on Electron devices, vol. 36, No. 2, Feb. 1989, pp. 416–423.

Carbajal III, Bernard G., Cline, Roger A. and Andresen, Bernhard H.; *A Successful HBM ESD Protection Circuit for Micron and Sub-Micron Level CMOS*; EOS/ESD Sumposium 92-234, pp. 5B2.1–5B.2.9.

*Primary Examiner*—Wael Fahmy
*Assistant Examiner*—Fetsum Abraham
*Attorney, Agent, or Firm*—Poms, Smith, Lande & Rose

[57] ABSTRACT

An input/output structure includes a microelectronic device connected in circuit between a contact pad and a reference potential, and a thyristor device for protecting the microelectronic device from electrostatic discharge. The thyristor device includes first and second terminals connected to the contact pad and to the reference potential respectively, a PNPN thyristor structure including a first P-region, a first N-region, a second P-region and a second N-region disposed in series between the first and second terminals, and an electrode for inducing an electric field into the second P-region. The induced electric field increases the number of charge carriers in the second P-region, and enables the device to be triggered at a lower voltage applied between the first and second terminals. The electrode includes an insulated gate, and can be connected to either the first or second terminal. The gate can include a thick field oxide layer, or a thin oxide layer to further reduce the triggering voltage. A differentiator including a capacitor connected between the first terminal and the electrode and a resistor connected between the second terminal and the electrode prevents false triggering during normal operation. A metal interconnection layer includes an anode section which is connected to the N-region and to the second terminal, and a cathode section which is connected to the P-region, the first terminal and the electrode, such that the cathode section laterally surrounds the anode section.

31 Claims, 6 Drawing Sheets

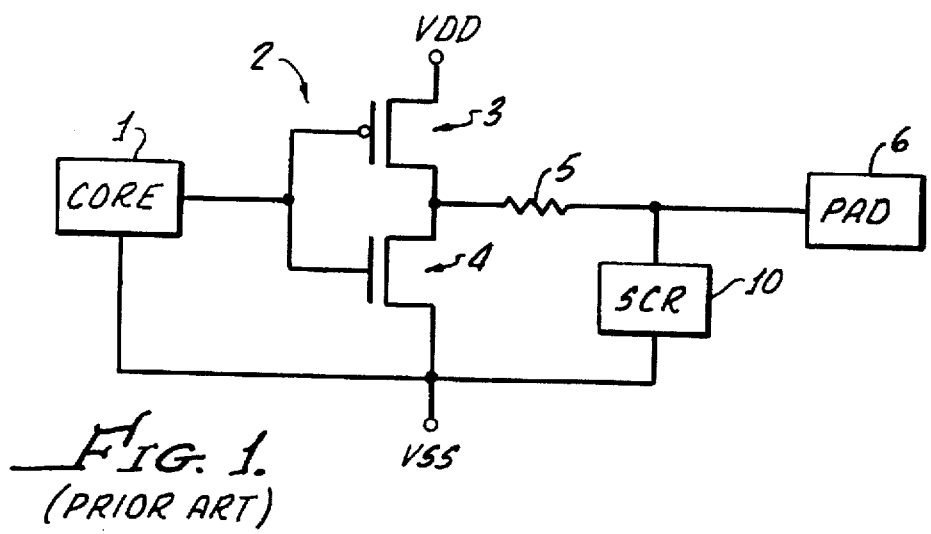
FIG. 1.
(PRIOR ART)
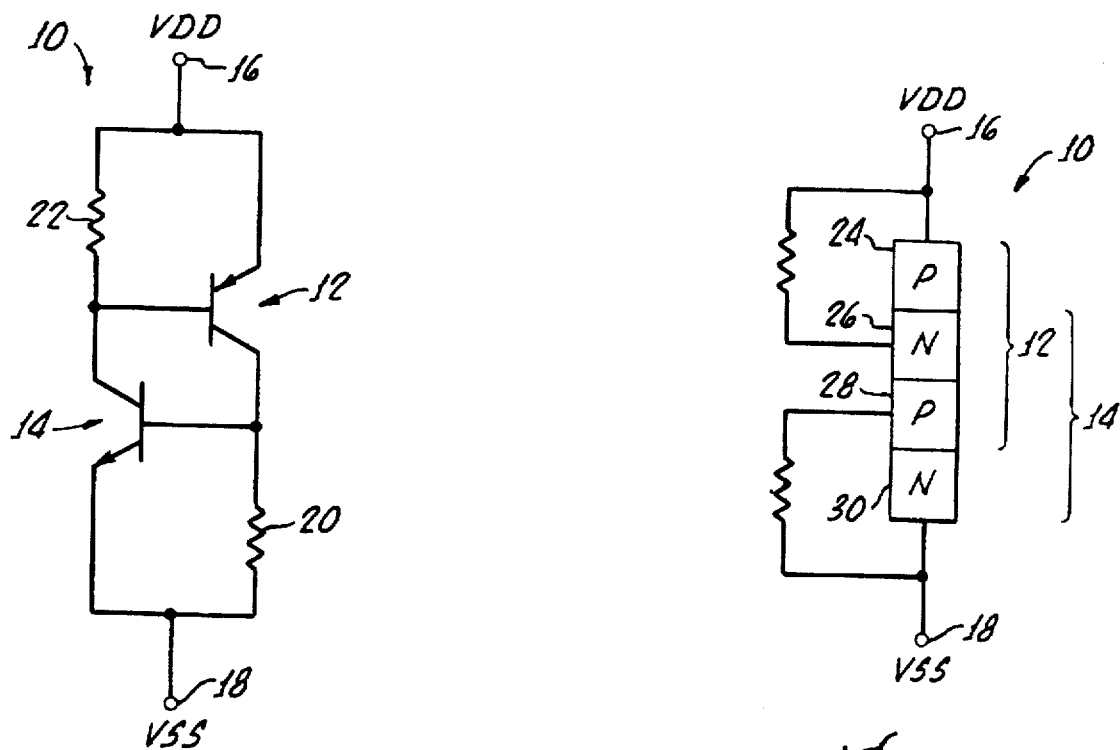
FIG. 2a.
(PRIOR ART)
FIG. 2b.
(PRIOR ART)

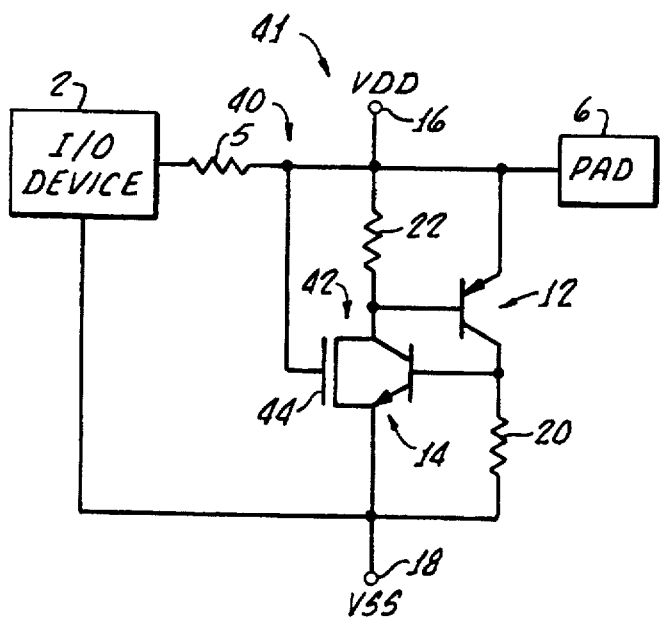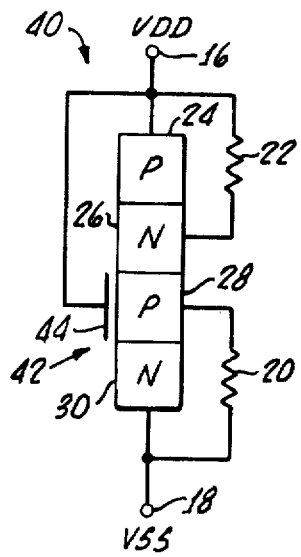
Fig. 3a.  Fig. 3b.
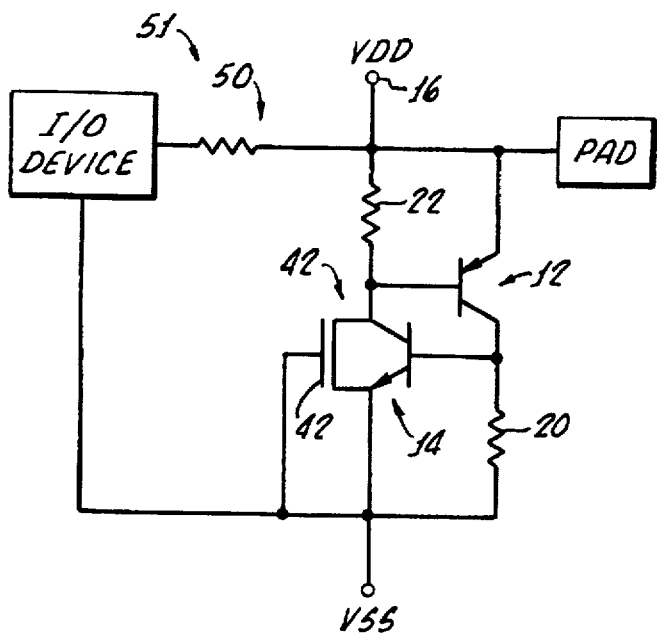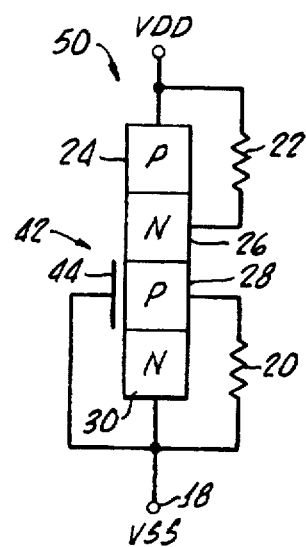
Fig. 4a.  Fig. 4b.

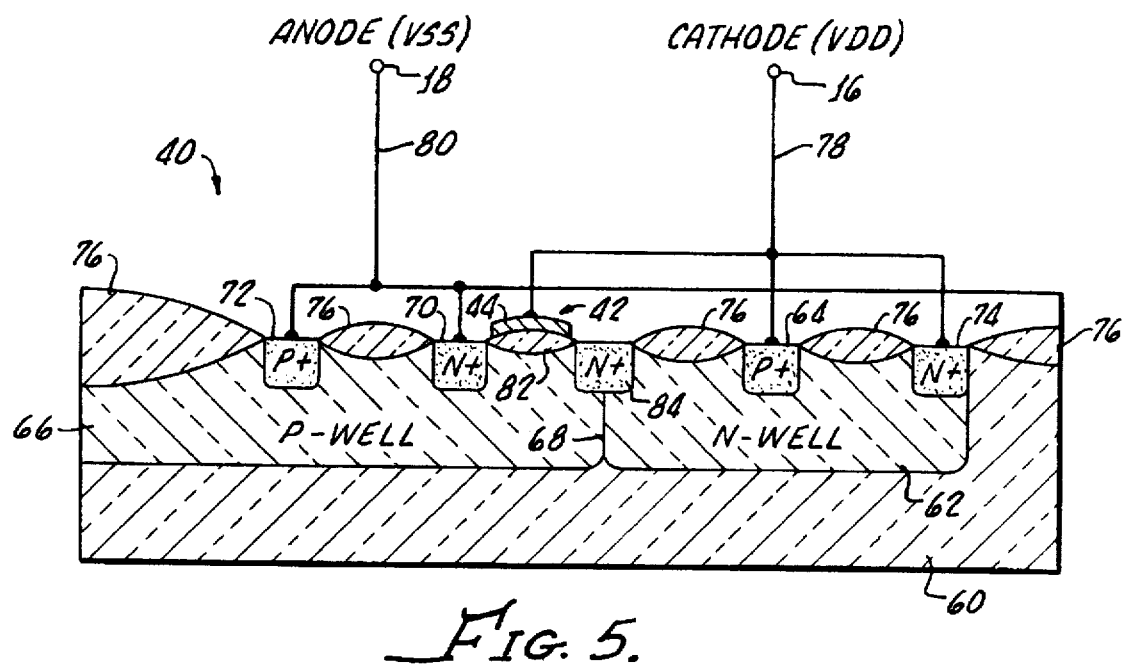
FIG. 5.
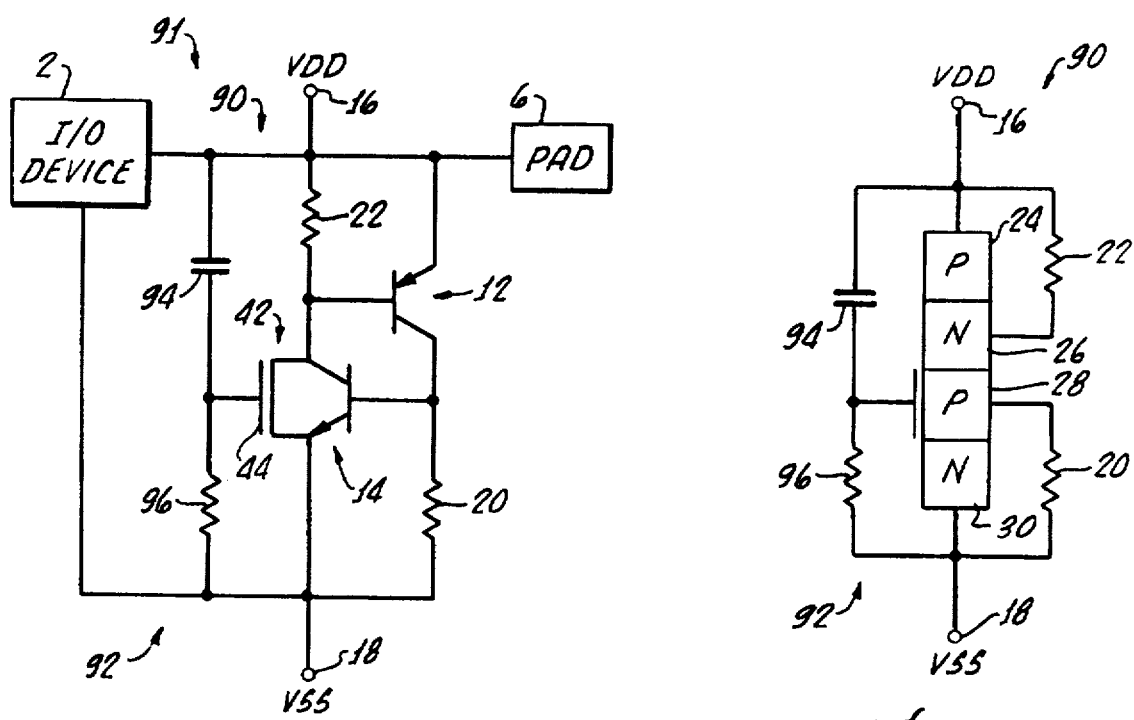
FIG. 6a.
FIG. 6b.

INPUT-OUTPUT (I/O) STRUCTURE WITH CAPACITIVELY TRIGGERED THYRISTOR FOR ELECTROSTATIC DISCHARGE (ESD) PROTECTION

BACKGROUND OF THE INVENTION

1. Field of the Invention

The present invention generally relates to the art of microelectronic integrated circuits, and more specifically to an input-output (I/O) structure with a capacitively triggered thyristor for electrostatic discharge (ESD) protection.

2. Description of the Related Art

Human beings, for example personnel handling integrated circuits, can develop high electrostatic voltages on their fingers which can be applied to the terminals or contact pads of the integrated circuits. These electrostatic voltages can be as high as several thousand volts, and can easily destroy microelectronic devices connected to the terminals. Complementary-Metal-Oxide-Semiconductor (CMOS) circuits are especially vulnerable to such damage.

For this reason, thyristors are provided across the terminals to dissipate electrostatic voltages and protect the sensitive microelectronic circuitry.

As illustrated in FIG. 1, a microelectronic integrated circuit comprises a core 1 of CMOS microelectronic circuitry or devices. A typical CMOS input/output (I/O) driver 2 includes a PMOS transistor 3 having its source connected to a positive power source VDD, its drain connected to the drain of an NMOS transistor 4, and its gate connected to an output of the core 1. The gate of the transistor 4 is also connected to the core 1, and the source of the transistor 4 is connected to a voltage source VSS which is negative relative to the source VDD. The voltage VSS constitutes a voltage or potential reference and can be a ground connection.

The drains of the transistors 3 and 4 are connected through a resistor 5 to an output terminal or contact pad 6 which provides external connectivity for the core 1. A thyristor 10 is connected to the pad 6 to provide electrostatic discharge protection for the core 1 and driver 2 in combination with the resistor 5.

The driver 2 is essentially a CMOS inverter. If the output of the core 1 is high, the transistor 3 is turned off and the transistor 4 is turned on, such that the resistor 5 and thereby the pad 6 are pulled low by the transistor 4. If the output of the core 1 is low, the transistor 3 is turned on and the transistor 4 is turned off, such that the resistor 5 and thereby the pad 6 are pulled high by the transistor 3.

Although an output structure is shown in FIG. 1, the illustrated arrangement is equally applicable to an input structure.

The thyristor 10, also known as a Silicon Controlled Rectifier (SCR), is a solid state latching device that can be used for a number of purposes. A thyristor has two stable states: a normal OFF state in which it presents a high impedance between its output terminals; and an ON state in which it presents a low impedance. The thyristor is triggered or switched from the OFF state to the ON state by the application of a suitable voltage signal, and remains in the ON state after the signal is removed.

A prior art thyristor 10 such as described in U.S. Pat. No. 5,225,702, entitled SILICON CONTROLLED RECTIFIER STRUCTURE FOR ELECTROSTATIC DISCHARGE PROTECTION, issued Jul. 6, 1993 to A. Chatterjee, is illustrated in FIGS. 2a and 2b. FIG. 2a is an equivalent electrical schematic diagram of the thyristor 10 as implemented using discrete transistors, and FIG. 2b is a diagram illustrating the thyristor 10 formed as an integral PNPN device.

As viewed in FIG. 2a, the thyristor 10 comprises two bipolar transistors, more specifically a PNP transistor 12 and an NPN transistor 14. The emitter of the transistor 12 is connected via a terminal 16 to the voltage source VDD, whereas the emitter of the transistor 14 is connected via a terminal 18 to a voltage source VSS.

The base of the transistor 12 is connected to the collector of the transistor 14, and the base of the transistor 14 is connected to the collector of the transistor 12. The collector of the transistor 12 is connected to the terminal 18 through a resistor 20, whereas the collector of the transistor 14 is connected to the terminal 16 through a resistor 22. Although the resistors 20 and 22 can be replaced with direct wire connections, the resistors 20 and 22 are preferably included because they reduce the voltage required to trigger the thyristor 10.

The thyristor 10 implemented as a PNPN device is illustrated in FIG. 2b, comprising a first P-region 24, a first N-region 26, a second P-region 28 and a second N-region connected in series between the terminals 16 and 18. The emitter, base and collector of the transistor 12 are constituted by the regions 24, 26 and 28, and the collector, base and emitter of the transistor 14 are constituted by the regions 26, 28 and 30 respectively.

In the basic application of the thyristor 10, a trigger input terminal (not shown) is connected to the base of the transistor 14, and the thyristor 10 is triggered by a positive trigger signal applied to the input terminal.

More specifically, the transistor 12 is normally reverse biased by the positive voltage applied through the resistor 22 from the terminal 16, and the transistor 14 is normally reverse biased by the negative voltage applied through the resistor 20 from the terminal 18. Both transistors 12 and 14 are turned off, and the thyristor 10 presents a high impedance OFF state between the terminals 16 and 18.

A positive trigger signal applied to the base of the transistor 14 turns on the transistor 14, thereby connecting the base of the transistor 12 to the negative voltage at the terminal 18. This turns on the transistor 12, thereby connecting the base of the transistor 14 to the positive voltage at the terminal 16 and turning on the transistor 14. With both transistors 12 and 14 turned on, the thyristor 10 presents a low impedance ON state between the terminals 16 and 18.

Both transistors 12 and 14 will maintain each other turned on after the trigger signal is removed. The transistors 12 and 14 can be turned off to return the thyristor 10 to the OFF state by reducing the potential between the terminals 16 and 18 to below a certain level. The thyristor 10 can alternatively triggered by applying a negative trigger signal to the base of the transistor 12.

In the application of the thyristor 10 as an ESD protection device as illustrated in FIG. 1, no trigger input is provided, and the thyristor 10 is connected across the input and/or output terminals of the integrated circuit.

The thyristor 10 remains in the OFF state as long as the voltage across the terminals 16 and 18 is below a certain value. When this value is exceeded, avalanche breakdown occurs across the PN junctions between the regions 24,26 and the regions 28,30, thereby causing the transistors 12 and 14 to be turned on as described above. The thyristor 10 is switched to its ON state, thereby providing a low impedance shunt across the circuitry connected to the terminal through which the electrostatic voltage can be safely discharged.

The trigger voltage of a thyristor used for ESD protection must be above the normal operating voltage range of the circuitry to prevent false triggering, and below the voltage at which damage to the circuitry will occur. This presents a problem in newer microelectronic integrated circuits which operate at reduced voltage levels. Conventional thyristors are triggered for avalanche breakdown at voltages of approximately 15 volts, which is too high to protect the newer low voltage devices.

The resistor 5 is necessary to enable prior art thyristors to function as ESD devices for conventional low voltage circuitry. However, the resistor 5 is undesirable because it typically has a value on the order of 70 ohms limits the output current of the driver 2.

SUMMARY OF THE INVENTION

An input/output structure embodying the present invention includes a microelectronic device connected in circuit between a contact pad and a reference potential, and a thyristor device for protecting the microelectronic device from electrostatic discharge.

The thyristor device includes first and second terminals connected to the contact pad and to the reference potential respectively, a PNPN thyristor structure including a first P-region, a first N-region, a second P-region and a second N-region disposed in series between the first and second terminals, and an electrode for inducing an electric field into the second P-region.

The induced electric field increases the number of charge carriers in the second P-region, and enables the device to be triggered at a lower voltage applied between the first and second terminals. The electrode includes an insulated gate, and can be connected to either the first or second terminal.

The gate can include a thick field oxide layer, or a thin oxide layer to further reduce the triggering voltage. A differentiator including a capacitor connected between the first terminal and the electrode and a resistor connected between the second terminal and the electrode prevents false triggering during normal operation.

A metal interconnection layer includes an anode section which is connected to the N-region and to the second terminal, and a cathode section which is connected to the P-region, the first terminal and the electrode, such that the cathode section laterally surrounds the anode section.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 1 is a diagram illustrating a prior art microelectronic output structure comprising a thyristor for ESD protection;

FIGS. 2a and 2b are diagrams illustrating a prior art thyristor or Silicon Controlled Rectifier (SCR);

FIGS. 3a and 3b are diagrams illustrating an output structure comprising a thyristor or SCR device embodying the present invention;

FIGS. 4a and 4b are diagrams illustrating another output structure comprising a thyristor of the invention;

FIG. 5 is a simplified sectional view of the thyristor illustrated in FIGS. 4a and 4b;

FIGS. 6a and 6b are diagrams illustrating another output structure comprising a thyristor of the invention;

DETAILED DESCRIPTION OF THE INVENTION

Figure 7:
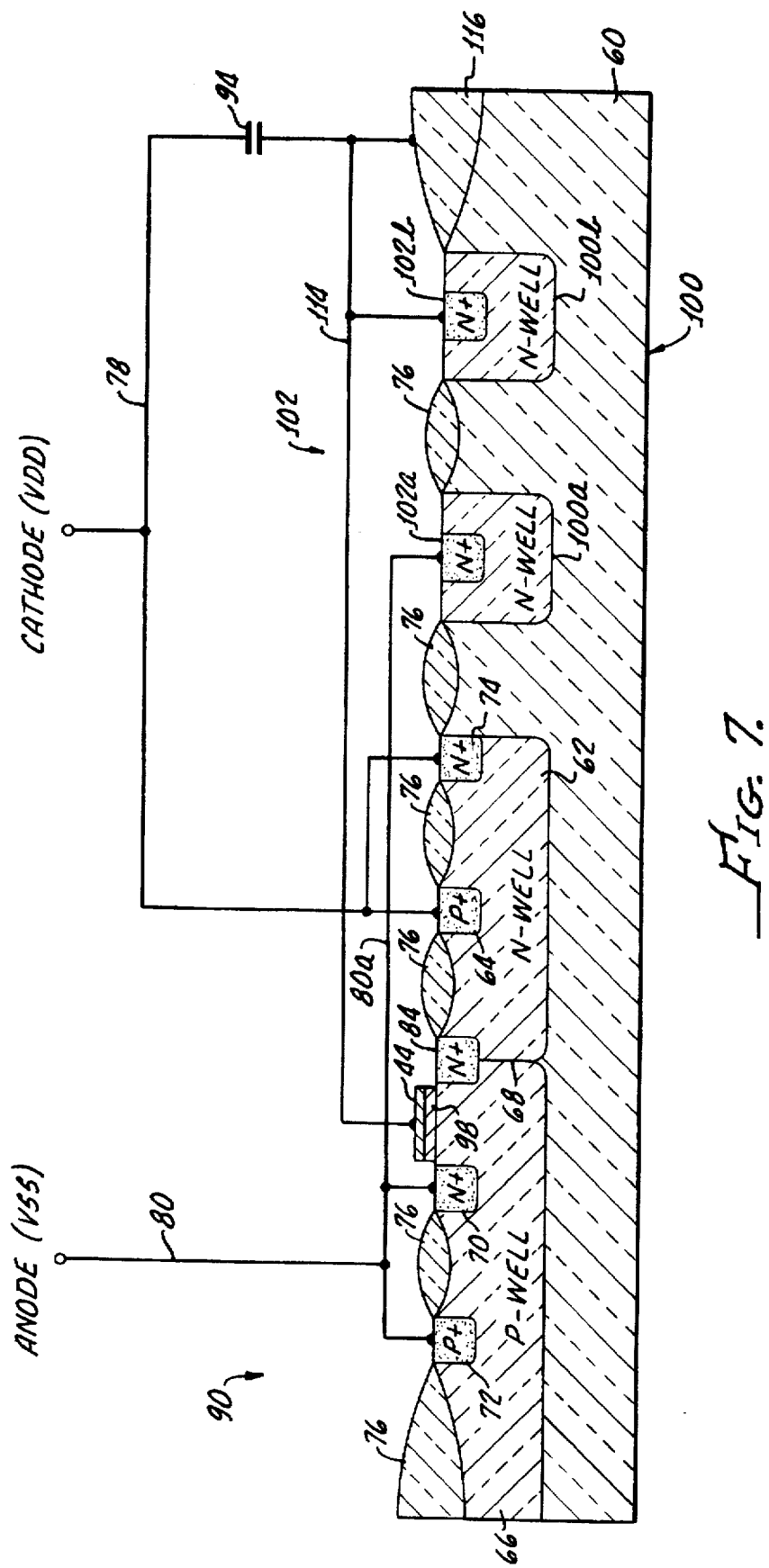
FIG. 7 is a simplified sectional view of the thyristor of FIGS. 6a and 6b.

An input/output (I/O) structure 41 including a thyristor 40 embodying the present invention is illustrated in FIGS. 3a and 3b, in which like elements are designated by the same reference numerals used in FIGS. 1, 2a and 2b. The basic operation of the thyristor 40 is the same as described above for the thyristor 10.

The thyristor 40 differs from the thyristor 10 by additionally comprising a Field-Effect Transistor (FET) 42 having its source and drain connected to the emitter and collector of the transistor 14 respectively. The gate of the FET 42, designated as an electrode 44, is connected to the terminal 16. As viewed in FIG. 3a, the gate or electrode 44 of the FET 42 is disposed to capacitively induce an electric field in the second P-region 28, which corresponds to the collector of the transistor 12 and the base of the transistor 14.

In normal operation, the voltage at the terminal 16 is applied to the gate 44 as well as across the thyristor 40, but is sufficiently low to not trigger the thyristor 40. However, in response to an applied high electrostatic voltage, the thyristor 40 is triggered and changes from the OFF state to the ON state as described above with reference to FIGS. 2a and 2b.

The voltage applied to the electrode 44 from the terminal 16 increases the number of charge carriers available for conduction in the region 28 by enhancing generation of hole-electron pairs, thereby enabling the thyristor 40 to be triggered at a lower voltage than if the gate 44 was not provided.

This phenomenon occurs in response to both positive and negative applied electrostatic voltages, and enables the present thyristor 40 to be used for ESD protection in newer low voltage circuitry to which conventional thyristors are inapplicable.

FIGS. 4a and 4b illustrate an I/O structure 51 including a thyristor 50 which is similar to the thyristor 40 except that the gate 44 of the FET 42 is connected to the terminal 18 rather than to the terminal 16.

FIG. 5 is a sectional view of the thyristor 40, which is formed on an integrated circuit semiconductor substrate 60. An N-well 62 which corresponds to the N-region 26 of FIG. 2b is formed in the substrate 60, and a P$^+$-region 64 which corresponds to the P-region 24 is formed in the N-well 62.

A P-well 66 which corresponds to the P-region 28 is formed in the substrate 60 adjacent to the N-well 62, with an interface or PN junction 68 being defined therebetween. An N$^+$-region 70 which corresponds to the N-region 30 is formed in the P-well 66.

A P$^+$-region 72 is formed in the P-well 66. The intrinsic resistance between the P$^+$-region 72 and the P-well 66 constitutes the resistor 20. An N$^+$-region 74 is formed in the N-well 62, and the intrinsic resistance between the N$^+$-region 74 and the N-well 62 constitutes the resistor 22.

Further illustrated are field oxide regions 76 which provide lateral electrical separation between the illustrated elements of the thyristor 40.

The terminal 16, which constitutes a cathode of the thyristor 40, is connected to the P$^+$-region 64 and to the N$^+$-region 74 by an interconnect metallization 78. The terminal 18, which constitutes an anode of the thyristor 40, is connected to the P$^+$-region 72 and to the N$^+$-region 70 by an interconnect metallization 80.

The FET 42 has an insulated gate comprising the electrode 44 which is in the form of a polysilicon or metal layer formed over a field oxide layer 82. The electrode 44 is connected to the interconnect metallization 78. The thyristor 40 further comprises an N$^+$-region 84 which straddles the interface 68.

The N$^+$regions 70 and 84 constitute the source and drain of the FET 42, with the electrode 44 and field oxide layer 82 being disposed therebetween. As described above, in response to a high electrostatic voltage applied to the terminal 16, this voltage is capacitively induced into the portion of the P-well 66 under the electrode 44, thereby increasing the number of available charge carriers by enhancing the generation of hole-electron pairs at the PN junction 68.

This reduces the voltage which is required to trigger the thyristor 40. The thyristor 40 typically has a trigger voltage of approximately 13 volts, which is suitable for numerous applications.

The gate length of the FET 42 (under the electrode 44) is preferably on the order of 1 micrometer, and the thickness of the field oxide layer 82 is preferably on the order of 8,000 Angstroms. However, the invention is not so limited, and can be embodied using other values of these variables which will provide the desired structural and function results in a particular application.

Due to the capacitive nature of the electrode 44, it is possible for sufficiently high transient voltages to be generated during normal operation of the thyristor 40 to undesirably trigger the thyristor 40. This phenomenon is prevented by a differentiator circuit 92 provided in an input/output structure 91 comprising a thyristor 90 as illustrated in FIGS. 6a and 6b.

The differentiator circuit 92 comprises a capacitor 94 connected between the terminal 16 and the electrode 44, and a resistor 96 connected between the terminal 18 and the electrode 44. The electrode 44 is normally maintained at the potential of the terminal 18 by the action of the capacitor 94. As the voltage at the terminal 16 rises in response to an applied electrostatic voltage, this voltage is coupled to the electrode through the capacitor 94 with the current being limited by the resistor 96 to trigger the thyristor 90.

The thyristor 90 also differs from the thyristor 40 in that the thick oxide layer 82 is replaced by a thin oxide layer 98 as illustrated in FIG. 7. Like elements are designated by the same reference numerals used in FIG. 5.

The thin oxide layer 98 has a thickness on the order of 80 Angstroms, although the invention is not so limited. Preferred values for the capacitor 94 and resistor 96 are 7×10$^{-15}$ farads and 60 kilo-ohms respectively. The configuration of the thyristor 90 with the thin oxide layer 98 further reduces the voltage required to trigger the thyristor 90 to approximately 7–8 volts, and also eliminates the need for the undesirable resistor 5.

Figure 8:
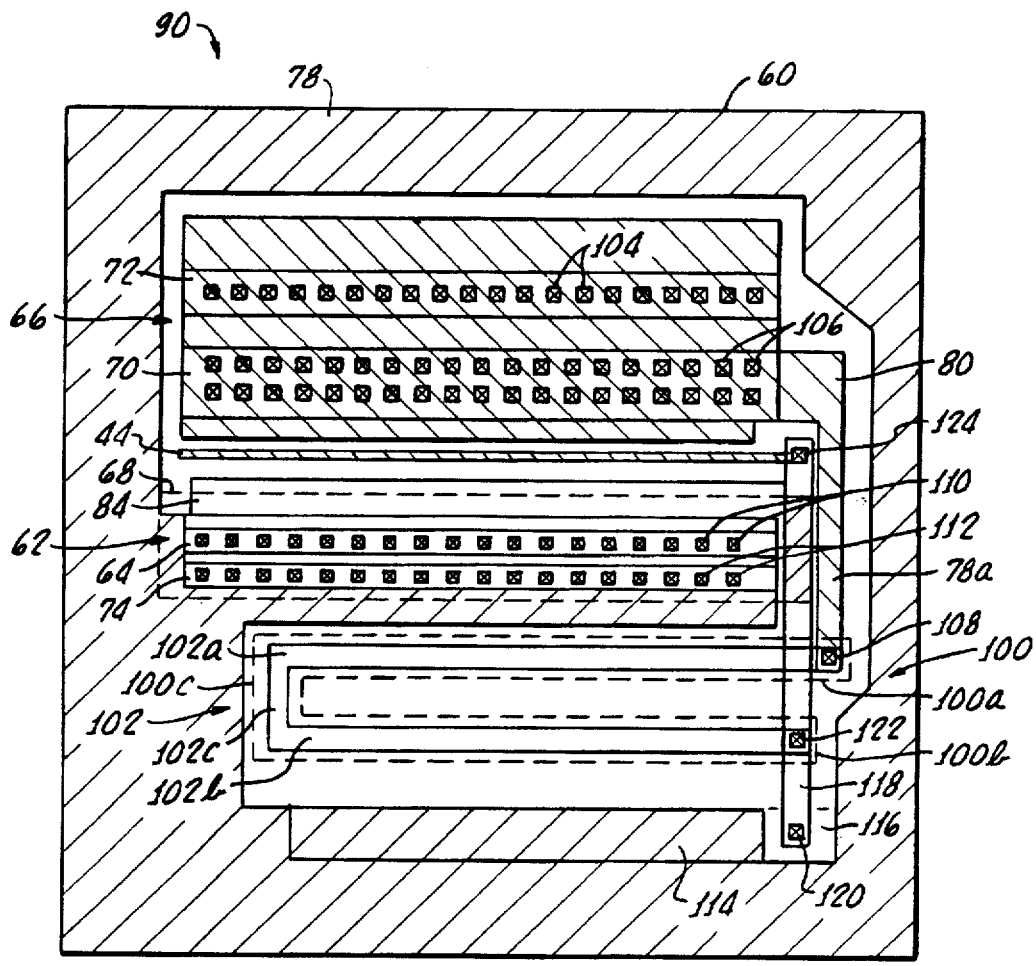
FIG. 8 is a plan view of the thyristor of FIGS. 6a and 6b.

FIG. 8 illustrates a physical layout of the thyristor 90 which enables it to be advantageously fabricated in an input-output (I/O) slot in an integrated circuit. With reference being made to FIGS. 7 and 8 in combination, the resistor 96 is formed in a serpentine configuration, including an N-well 100 including parallel sections 100a and 100b and a connecting section 100c. A similarly shaped N$^+$-region 102 is formed in the N-well 100, including parallel sections 102a and 102b and a connecting section 102c.

Although not explicitly shown, an insulating layer is formed over the substrate 60, and the interconnect metallizations 78 and 80 are formed over the insulating layer as sections of a single metal layer METAL1.

The anode metallization 80 is connected to the P$^+$-region 72 by vertical interconnects or vias 104 formed through the insulating layer. The metallization 80 is similarly connected to the N$^+$-region 70 by vias 106. The metallization 80 includes an extension 80a which is connected to one end of the section 102a of the N$^+$-region 102 of the resistor 96 by a via 108.

The cathode metallization 78 laterally surrounds the anode metallization 80, thereby enabling the metallization 78 to be connected to an I/O device, terminal or contact pad, or other element at any point along its periphery. The metallization 78 is connected to the P$^+$-region 64 by vias 110 and to the N$^+$-region by vias 112.

The metallization 78 constitutes the upper plate of the capacitor 94, with the insulating layer serving as the dielectric and a lower plate 114 being formed underneath. The lower plate 114 is connected to a conductive polysilicon layer 116 which serves as a connector.

The polysilicon layer 116 is connected to a metallization section 118 of the METAL1 layer by a via 120. The section 118 is connected to the end of the section 102b of the N$^+$-region 102 of the resistor 96 by a via 122, and to the conductor 44 by a via 124.

Figure 9:
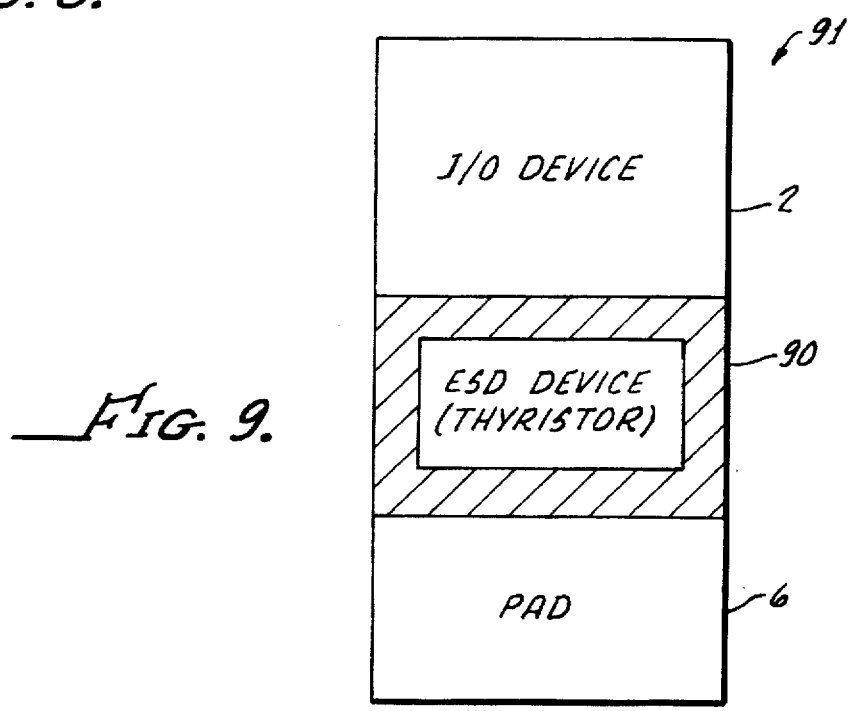
FIG. 9 is a simplified plan view of an I/O slot of an integrated circuit including an I/O structure comprising a thyristor of the present invention provided therein.
Figure 10:
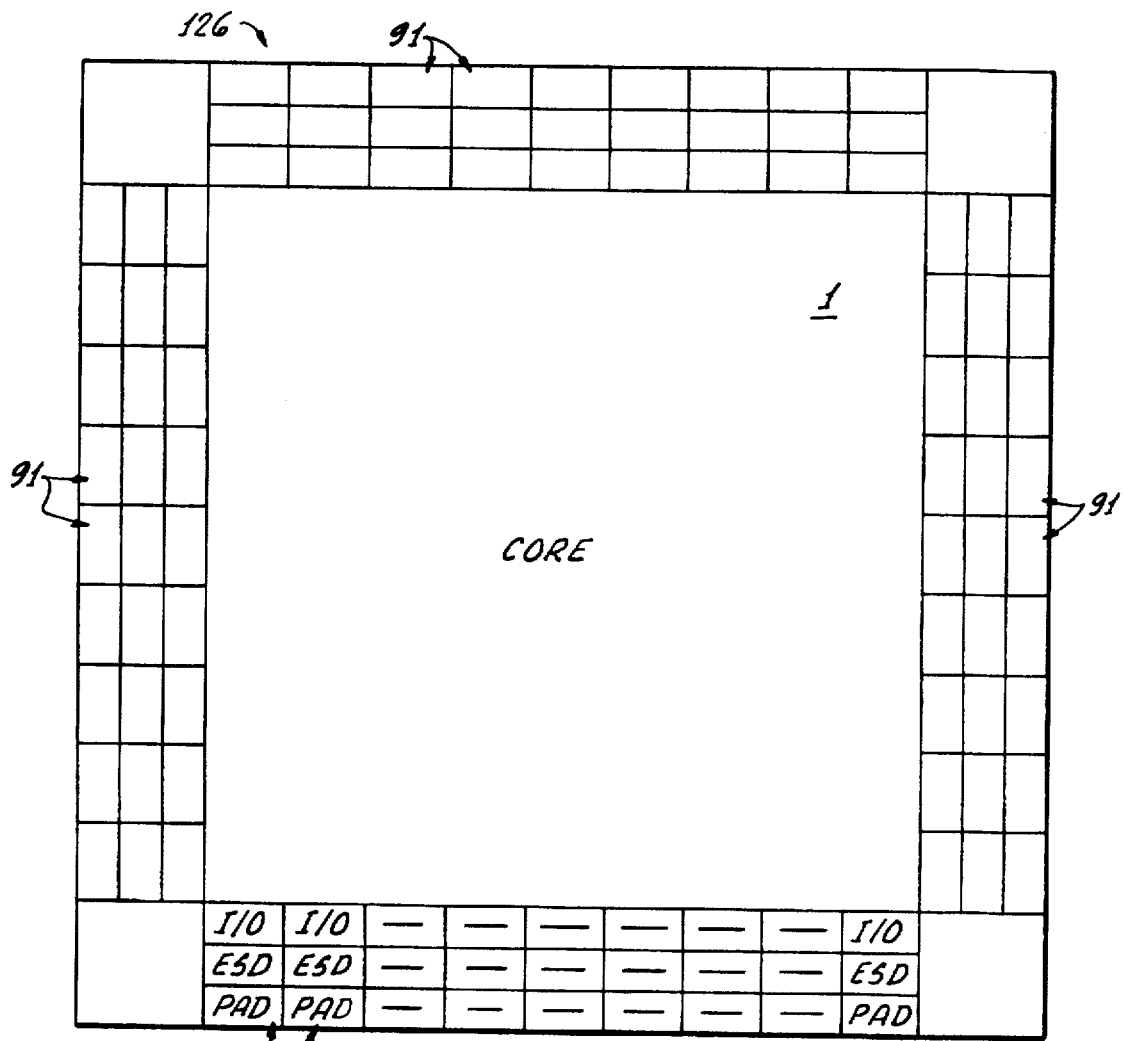
FIG. 10 is a simplified plan view of a microelectronic integrated circuit comprising a plurality of I/O structures embodying the present invention.

FIG. 9 illustrates the input/output structure 91 comprising the thyristor 90 configured as illustrated in FIG. 8. This arrangement can be accommodated in a standard input/output slot configuration in a microelectronic integrated circuit. FIG. 10 illustrates a microelectronic integrated circuit 126 comprising the core 1 and a plurality of input/output structures configured as illustrated in FIG. 9 spaced along the periphery thereof.

Various modifications will become possible for those skilled in the art after receiving the teachings of the present disclosure without departing from the scope thereof.

Figure 11A:
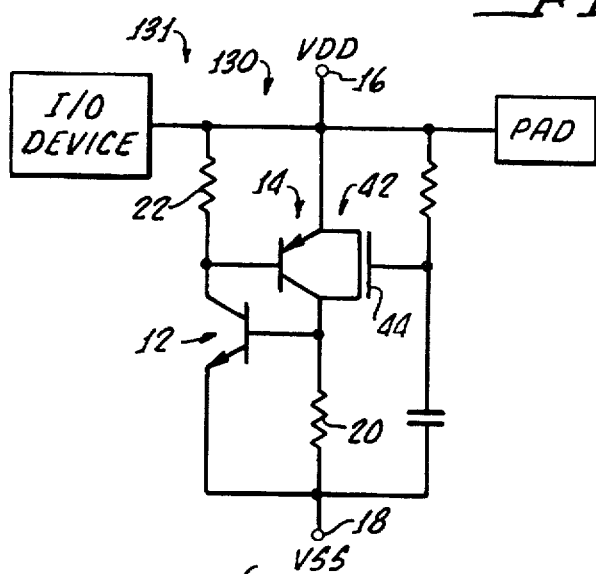
FIGS. 11a and 11b are diagrams illustrating another I/O structure of the invention.
Figure 11B:
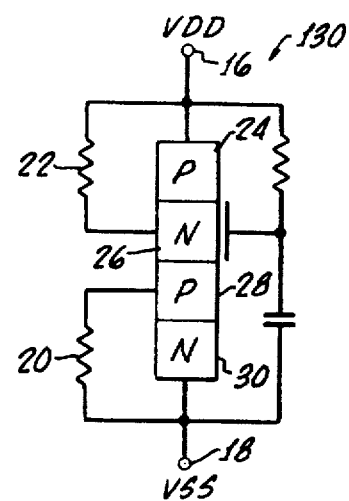

For example, as illustrated in FIGS. 11a and 11b, the electrode 44 can be disposed to induce an electric field into the N-region 26 rather than into the P-region 28. In an input/output structure 131 comprising a thyristor 130, the FET 42 is connected across the emitter and collector of the transistor 12, and the electrode 44 (gate of the FET 42) is connected through the resistor 22 to the terminal 16. The electrode 44 is further connected to the terminal 18 through the capacitor 94.

I claim:

1. An input/output structure comprising:

microelectronic device connected in circuit between a contact pad and a reference potential;

a thyristor device for protecting the microelectronic device from electrostatic discharge, the thyristor device including:

a first terminal connected to the contact pad;

a second terminal connected to the reference potential;

a PNPN thyristor structure including a first P-region, a first N-region, a second P-region and a second N-region disposed in series between the first and second terminals; and an electrode for inducing an electric field into one of the first N-region and the second P-region;

a capacitor connected between the first terminal and the electrode; and a resistor connected between the second terminal and the electrode.

2. An input/output structure as in claim 1, in which:

the first terminal is connected in circuit to the first N-region; and the second terminal is connected in circuit to the second P-region.

3. An input/output structure as in claim 1, further comprising:

a first resistor connected between the first terminal and the first N-region; and a second resistor connected between the second terminal and the second P-region.

4. An input/output structure as in claim 1, in which the electrode comprises an insulated gate.

5. An input/output structure as in claim 4, in which the insulated gate comprises:

a field oxide layer; and an electrically conductive layer formed on the field oxide layer.

6. An input/output structure as in claim 5, in which the field oxide layer has a thickness of approximately 8,000 Angstroms.

7. An input/output structure as in claim 5, further comprising:

a resistor connected between the microelectronic device and the contact pad, in which:

the first terminal is connected to the contact pad.

8. An input/output structure as in claim 4, in which the insulated gate comprises:

a thin oxide layer; and an electrically conductive layer formed on the thin oxide layer.

9. An input/output structure as in claim 8, in which the thin oxide layer has a thickness of approximately 80 Angstroms.

10. An input/output structure as in claim 1, in which the electrode is disposed for capacitively inducing an electric field into the first N-region.

11. An input/output structure comprising:

a microelectronic device connected in circuit between a contact pad and a reference potential;

a thyristor device for protecting the microelectronic device from electrostatic discharge, the thyristor device including:

a first terminal connected to the contact pad;

a second terminal connected to the reference potential;

a PNPN thyristor structure including a first P-region, a first N-region, a second P-region and a second N-region disposed in series between the first and second terminals; and an electrode for inducing an electric field into one of the first N-region and the second P-region;

a capacitor connected between the second terminal and the electrode; and a resistor connected between the first terminal and the electrode.

12. An input/output structure comprising:

a microelectronic device connected in circuit between a contact pad and a reference potential;

a thyristor device for protecting the microelectronic device from electrostatic discharge, the thyristor device including:

a first terminal connected to the contact pad;

a second terminal connected to the reference potential;

a PNPN thyristor structure including a first P-region, a first N-region, a second P-region and a second N-region disposed in series between the first and second terminals; and an electrode for inducing an electric field into one of the first N-region and the second P-region, the electrode being disposed for capacitively inducing an electric field into the second P-region;

a capacitor connected between the first terminal and the electrode; and a resistor connected between the second terminal and the electrode.

13. An input/output structure as in claim 12, in which the capacitor has a value of approximately $7 \times 10^{-15}$ farads.

14. An input/output structure as in claim 12, in which the resistor has a value of approximately 60 kilo-ohms.

15. An input/output structure comprising:

a semiconductor substrate;

a contact pad formed on the substrate;

a microelectronic device which is formed on the substrate and connected in circuit between the contact pad and a reference potential;

a thyristor device for protecting the microelectronic device from electrostatic discharge, the thyristor device including:

a P-well formed in the substrate;

an N-well formed in the substrate laterally adjacent to the P-well;

a P-region formed in the N-well;

a first terminal connected to the contact pad and to the P-region;

an N-region formed in the P-well;

a second terminal connected to the reference potential and to the N-region;

first circuit means connecting the first terminal to the N-well;

second circuit means connecting the second terminal to the P-well; and an electrode formed over a portion of the P-well between the N-region and the N-well for inducing an electric field into said portion;

a capacitor connected between the first terminal and the electrode; and a resistor connected between the second terminal and the electrode.

16. An input/output structure as in claim 15, in which:

the first circuit means comprises a first resistor; and the second circuit means comprises a second resistor.

17. An input/output structure as in claim 16, in which:

the first resistor comprises a $P^+$-region formed in the P-well; and the second resistor comprises an $N^+$-region formed in the N-well.

18. An input/output structure as in claim 15, further comprising an $N^+$-region formed at an interface between the P-well and the N-well, in which:

said portion of the P-well is between the N-region and the $N^+$-region.

19. An input/output structure as in claim 18, in which:

the N-region is an N$^+$-region; and the P-region is a P$^+$-region.

20. An input/output structure as in claim 15, in which the electrode comprises an insulated gate.

21. An input/output structure as in claim 20, in which the insulated gate comprises:

a field oxide layer; and an electrically conductive layer formed on the field oxide layer.

22. An input/output structure as in claim 21, further comprising:

a resistor connected between the microelectronic device and the contact pad, in which:

the first terminal is connected to the contact pad.

23. An input/output structure as in claim 21, in which the field oxide layer has a thickness of approximately 8,000 Angstroms.

24. An input/output structure as in claim 20, in which the insulated gate comprises:

a thin oxide layer; and an electrically conductive layer formed on the thin oxide layer.

25. An input/output structure as in claim 24, in which the thin oxide layer has a thickness of approximately 80 Angstroms.

26. An input/output structure as in claim 15, in which the capacitor has a value of approximately $7 \times 10^{-15}$ farads.

27. An input/output structure as in claim 15, in which the resistor has a value of approximately 60 kilo-ohms.

28. An input/output structure as in claim 15, further comprising a metal interconnection layer including:

an anode section connected to the N-region and to the second terminal; and a cathode section connected to the P-region, the first terminal and the electrode, in which:

the cathode section laterally surrounds the anode section.

29. An input/output structure comprising:

a semiconductor substrate;

a contact pad formed on the substrate;

a microelectronic device which is formed on the substrate and connected in circuit between the contact pad and a reference potential; and a thyristor device for protecting the microelectronic device from electrostatic discharge, the thyristor device including:

a P-well formed in the substrate;

an N-well formed in the substrate laterally adjacent to the P-well;

a P-region formed in the N-well;

a first terminal connected to the contact pad and to the P-region;

an N-region formed in the P-well;

a second terminal connected to the reference potential and to the N-region;

first circuit means connecting the first terminal to the N-well;

second circuit means connecting the second terminal to the P-well; and an electrode formed over a portion of the P-well between the N-region and the N-well for inducing an electric field into said portion;

a metal interconnection layer including:

an anode section connected to the N-region and to the second terminal; and a cathode section connected to the P-region, the first terminal and the electrode, in which the cathode section laterally surrounds the anode section;

a capacitor connected between the first terminal and the electrode; and a resistor connected between the second terminal and the electrode, in which:

the cathode section laterally surrounds the resistor.

30. An input/output structure as in claim 29, in which the resistor comprises an N-well resistor.

31. An input/output structure as in claim 29, in which a portion of the cathode section constitutes a plate of the capacitor.

* * * * *